(12) United States Patent
Dehe

(10) Patent No.: US 8,737,674 B2
(45) Date of Patent: May 27, 2014

(54) HOUSED LOUDSPEAKER ARRAY

(75) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 559 days.

(21) Appl. No.: 13/026,002

(22) Filed: Feb. 11, 2011

(65) Prior Publication Data

US 2012/0207332 A1 Aug. 16, 2012

(51) Int. Cl.
*H04R 1/02* (2006.01)
*H04R 25/00* (2006.01)
*H01L 29/40* (2006.01)

(52) U.S. Cl.
USPC ............ 381/395; 381/182; 381/186; 257/245

(58) Field of Classification Search
USPC ................. 381/182, 186, 191, 345, 351, 395; 257/245, 254, 416
See application file for complete search history.

(56) References Cited

U.S. PATENT DOCUMENTS

| | | | |
|---|---|---|---|
| 6,178,249 B1 | 1/2001 | Hietanen et al. | |
| 6,806,593 B2* | 10/2004 | Tai et al. | 381/191 |
| 7,045,459 B2* | 5/2006 | Freidhoff | 438/666 |
| 7,902,615 B2 | 3/2011 | Schlosser et al. | |
| 8,180,093 B2* | 5/2012 | Hankey et al. | 381/374 |
| 2008/0083957 A1* | 4/2008 | Wei et al. | 257/415 |
| 2008/0279407 A1 | 11/2008 | Pahl | |
| 2009/0001553 A1* | 1/2009 | Pahl et al. | 257/704 |
| 2009/0101998 A1* | 4/2009 | Yen et al. | 257/416 |
| 2010/0008521 A1 | 1/2010 | Cohen et al. | |

FOREIGN PATENT DOCUMENTS

| | | |
|---|---|---|
| DE | 10 2005 053 767 A1 | 5/2007 |
| DE | 10 2005 056 759 A1 | 5/2007 |
| EP | 2 051 539 A1 | 4/2009 |
| JP | 2006-121465 | 5/2006 |
| WO | WO 2010/023776 A1 | 3/2010 |

\* cited by examiner

*Primary Examiner* — Jesse Elbin
(74) *Attorney, Agent, or Firm* — Slater & Matsil, L.L.P.

(57) ABSTRACT

A housed loudspeaker array includes a first substrate having a plurality of loudspeaker elements formed therein, a second substrate fixed at a first surface of the first substrate in a flip-chip manner and comprising a plurality of orifices that are aligned with the loudspeaker elements of the plurality of loudspeaker elements of the first substrate, and a cover applied to a second surface of the first substrate opposite to the first surface. A method for manufacturing the housed loudspeaker array is also disclosed.

21 Claims, 19 Drawing Sheets

HOUSED LOUDSPEAKER ARRAY

TECHNICAL FIELD

Some embodiments according to the invention are related to a housed loudspeaker array. Some embodiments according to the invention are related to a method for manufacturing a housed loudspeaker array.

BACKGROUND

A majority of the loudspeakers manufactured and used today follow a relatively old basic design. A common design of a loudspeaker comprises a permanent magnet, a movable coil within a magnetic field produced by the permanent magnet, and a membrane attached to the movable coil. An alternating electric current flowing through the coil causes the coil to oscillate within the magnetic field, thus driving the membrane, which in turn produces a sound. This basic design is used for a large number of electrodynamic loudspeakers, which typically have a relatively large back volume behind the membrane, i.e., at a side of the membrane opposite to the side of the membrane from which the sound waves are propagated to the environment. The size of the back volume of an electrodynamic loudspeaker is typically reciprocally related to the intended frequency range of the loudspeaker, that is, a loudspeaker of a low frequency range typically has a relatively large back volume.

The ongoing desire to miniaturize electronic components and electromechanical components has caused extensive research in the field of micro-electromechanical systems (MEMS), which are small mechanical devices driven by electricity. MEMS became practical once they could be fabricated using modified semiconductor device fabrication technologies, normally used to make electronics. These fabrication technologies include molding and plating, wet etching (KOH (potassium hydroxide), TMAH (Tetramethylammonium Hydroxide)) and dry etching (RIE (Reactive-Ion Etching) and DRIE (Deep Reactive-Ion Etching)), electro discharge machining (EDM), and other technologies capable of manufacturing small devices. Loudspeakers are a possible application of micro-electromechanical systems. In order to achieve a sufficient sound pressure level (SPL), loudspeakers fabricated by means of MEMS technology typically need to be arranged as an array comprising a plurality of basic loudspeaker elements.

SUMMARY OF THE INVENTION

Some embodiments according to the invention provide a housed loudspeaker array comprising a first substrate, a second substrate, and a cover. The first substrate has a plurality of loudspeaker elements formed therein. The second substrate is fixed at a first surface of the first substrate in a flip-chip manner and comprises a plurality of orifices that are aligned with the loudspeaker elements of the plurality of loudspeaker elements of the first substrate. The cover is applied to a second surface of the first substrate opposite to the first surface.

In another embodiment according to the teachings disclosed herein, a housed loudspeaker array comprises a first substrate having a plurality of loudspeaker elements formed therein, a second substrate fixed at a first surface of the first substrate in a flip-chip manner, and comprising a plurality of apertures that are aligned with the loudspeaker elements of the plurality of loudspeaker elements of the first substrate, and a cover comprising a deep-drawn film applied to a second surface of the first substrate opposite to the first surface.

A method for manufacturing a housed loudspeaker array according to the teachings disclosed herein comprises providing a first substrate having a plurality of loudspeaker elements; providing a second substrate comprising a plurality of orifices arranged in a manner corresponding to the plurality of loudspeaker elements; fixing the second substrate to a first surface of the first substrate in a flip-chip manner so that the plurality of orifices are aligned to (or with) the loudspeaker elements of the plurality of loudspeakers of the first substrate; and applying a cover to a second surface of the first substrate opposite to the first surface as a cover for the loudspeaker array.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
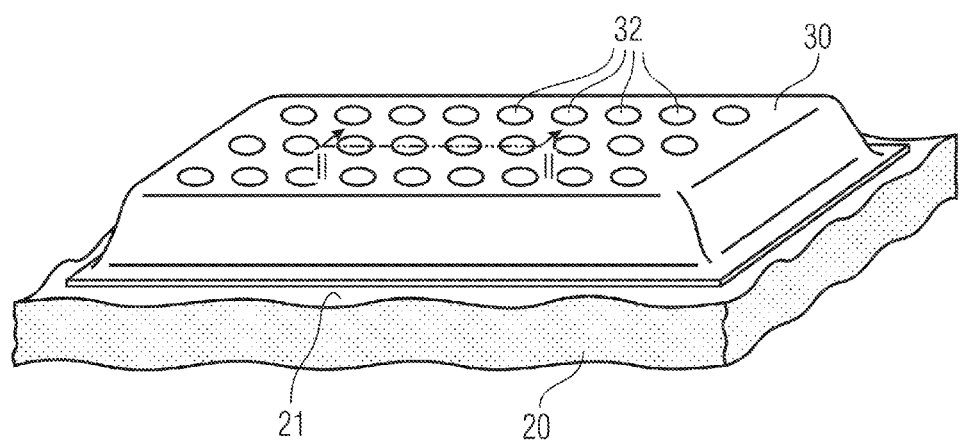
FIG. 1 shows a perspective view of a housed loudspeaker array according to the teachings disclosed herein.

Different embodiments of the teachings disclosed herein will be subsequently be discussed referring to FIGS. 1 to 19, wherein in the drawings identical reference numerals are given to objects having an identical function or a similar function so that objects referred to by identical reference numerals within the different embodiments are interchangeable and the description thereof is mutually applicable.

FIG. 1 shows a perspective view of a housed loudspeaker array. The housed loudspeaker array comprises a second substrate 20 which, in the embodiment depicted in FIG. 1, also acts as a support for the housed loudspeaker array. The second substrate 20 has a first main surface 21 to which a first substrate (not visible in FIG. 1) is fixed. The first substrate is covered by a cover 30. The cover 30 encloses the first substrate substantially at five sides of the first substrate and is fixed to the first main surface 21 of the second substrate 20 at a circumferential edge or region of the cover 30. The cover 30 may be glued, soldered, of welded to the first main surface 21 of the second substrate 20. Other methods for mechanically connecting two pieces may equally be used. The cover 30 may comprise a film which is flexible and may therefore be wrapped around the first substrate to provide a substantially sealed cavity between the cover 30 and the second substrate 20 (except for intentionally provided holes or orifices in the second substrate as will be explained below).

At a top side of the cover 30, a plurality of small protrusions or bumps 32 can be observed. These bumps 32 are typically related to a plurality of loudspeaker elements. The bumps 32 are not necessarily present in every embodiment of a housed loudspeaker array according to the teachings disclosed herein.

In FIG. 1, only a portion of the second substrate 20 is shown. The second substrate 20 could be larger and further combinations of a first substrate and a cover 30 could be provided at the first main surface 21 of the second substrate 20 adjacent to the one exemplary combination that is shown in FIG. 1. In this manner, a plurality of housed loudspeaker arrays may be arranged on the same second substrate 20 acting as a support and singulated at a later stage.

Figure 2:
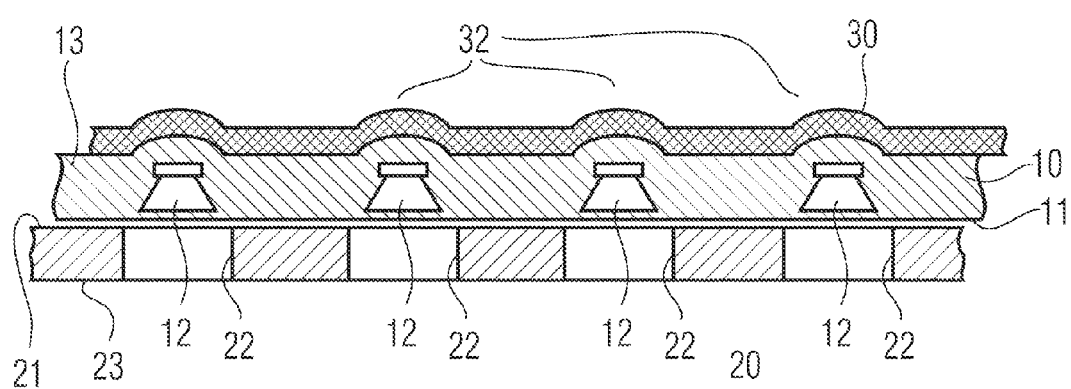
FIG. 2 shows a partial cross-section through the housed loudspeaker array of FIG. 1.

FIG. 2 shows a cross-section through the housed loudspeaker array of FIG. 1 along the line II-II. It can be seen that the first substrate 10 is fixed at the first surface 21 of the second substrate 20, or vice-a-versa. A first main surface 11 of the first substrate 10 faces the second substrate 20. The first substrate 10 also comprises a second main surface 13, to which the cover 30 is applied. Embedded within the first substrate 10 is a plurality of loudspeaker elements 12. Typically, the plurality of loudspeaker elements is integrally formed with the first substrate 10 during a manufacturing of the first substrate 10. In accordance with FIG. 1, each one of the plurality of loudspeaker elements 12 have a small bump at the second main surface 13 of the first substrate 10 associated with it. The cover 30 follows these bumps to produce the plurality of bumps 32.

A second substrate 20 comprises a plurality of orifices 22 which are aligned with the plurality of loudspeaker elements 12, i.e. each orifice 22 is aligned with a specific loudspeaker element 12. The orifices 22 allow a sound wave produced by the plurality of loudspeaker elements 12 to pass through the second substrate 20 and to be propagated at a side of the second substrate 20, opposite to its first main surface 21, that is, at the side of a second main surface 23 of the second substrate 20.

In FIG. 2, a small gap is shown between the first substrate 10 and the second substrate 20. This small gap may be caused by a flip-chip process by means of which the second substrate 20 is fixed to the first substrate 10. In particular, the flip-chip process may comprise a placement of solder balls at the first main surface 11 of the first substrate 10 and/or the first main surface 21 of the second substrate 20. By means of the solder balls, electrical connections 20 may be obtained between the first substrate 10 and the second substrate. The solder balls may typically also provide a mechanical connection between the first substrate 10 and the second substrate 20.

Figure 3:
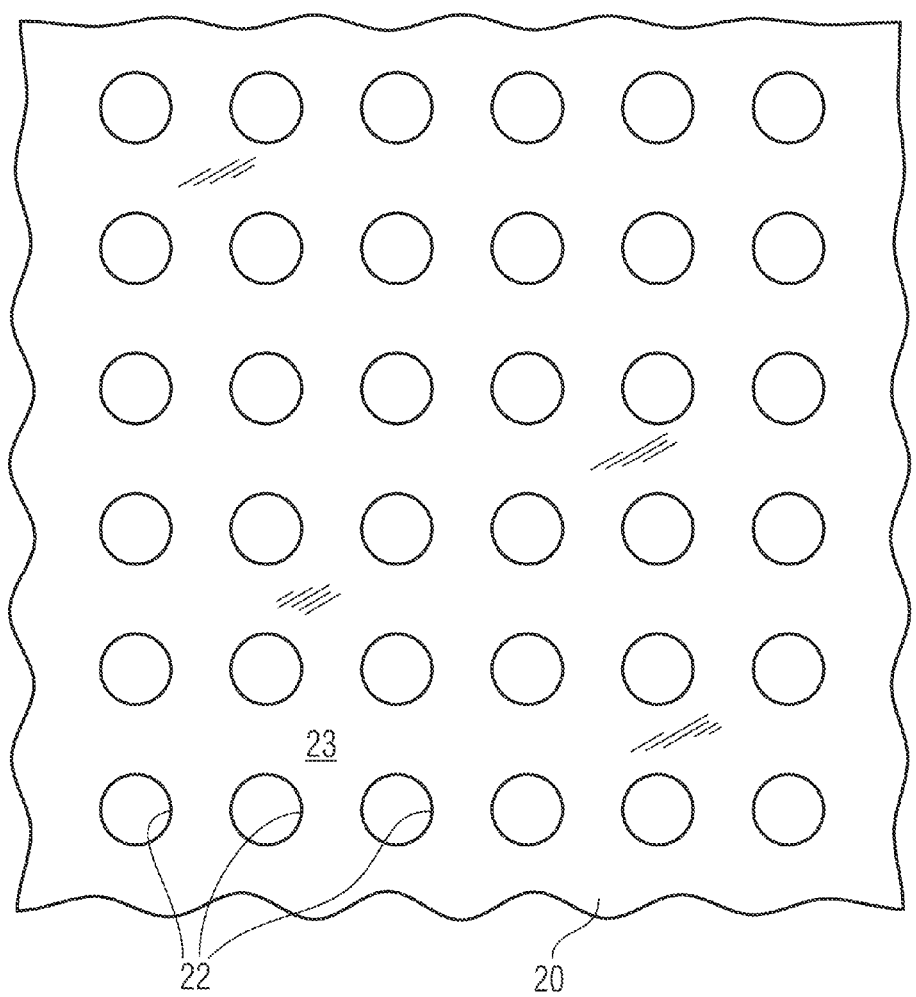
FIG. 3 shows a bottom view of a housed loudspeaker array according to the teachings disclosed herein, i.e. a bottom surface of a second substrate of the housed loudspeaker array.

FIG. 3 shows a bottom view of the housed loudspeaker array similar to the ones shown in FIGS. 1 and 2. The second main surface 23 of the second substrate 20 can be seen. Furthermore, the plurality of orifices 22 can also be seen. Behind each one of the plurality of orifices 22, a loudspeaker element 12 is provided in the first substrate 10 (not illustrated in FIG. 3), in order to produce a sound wave. Loud-speakers implemented in micro-electromechanical system technologies typically need to be arranged as an array in order to produce a sufficient sound pressure level. The array of loudspeaker elements 12 needs to be supplied with the audio signal to be transduced, which requires a high number of connections between the individual array elements and, for example, a driver ASIC (Application Specific Integrated Circuit). With existing micro-electromechanical loudspeaker arrays, the costs may be dominated by the connection technology required for supplying the audio signal to each one of the array elements. Often a high number of bond wires together with a housing having many connections corresponding to the number of used channels are necessary.

According to the teachings disclosed herein, flip-chip connections are proposed to replace the bond wire connections. The high number of connections in an array is well-suited for this technology. The combination or grouping of various data and signal lines is done in the planar technology of the support, i.e. the second substrate 20. At the same time, one or several driver ICs may be integrated in a housing using the same technology. The housing, in particular, the second substrate 20 and the cover 30, may provide the electrical interconnection of the array(s), as well as the acoustic function of the loudspeaker. According to the teachings disclosed herein, especially silicon-based loudspeaker arrays or other semiconductor-based loudspeaker arrays may be assembled in flip-chip technology, to provide a cheap and/or flat housing for the application.

Figure 4:
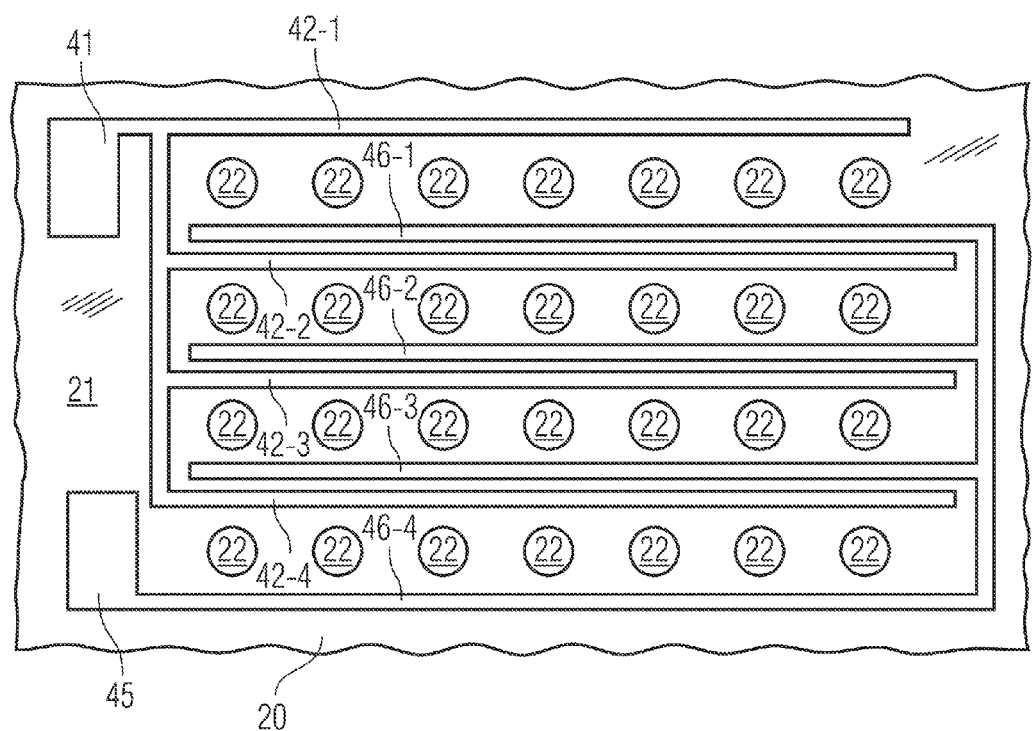
FIG. 4 shows a top view of a second substrate according to an embodiment of the teachings disclosed herein.

FIG. 4 shows a top view of the second substrate 20 according to an embodiment of the teachings disclosed herein. In FIG. 4, the first main surface 21 of the second substrate 20 can be seen. The second substrate 20 comprises an exemplary 7-by-4 array of orifices 22 which are aligned with corresponding loudspeaker elements 12 of a first substrate 10. In order to supply an electrical audio signal to the loudspeaker elements 12, the second substrate 20 comprises a pair of loudspeaker input signal connectors 41, 45, and electrically conducting connections 42-1 to 42-4 and 46-1 to 46-4. The loudspeaker input signal connector 41 is electrically connected to the electrically conducting connections 42-1, 42-2, 42-3, and 42-4. The electrically conducting connections 42-1 to 42-4 are provided in the form of horizontal strip lines which extend above a corresponding row of the orifices 22 of the 4-by-7 array. Likewise, the loudspeaker input signal connector 45 is electrically connected to the electrically conducting connections 46-1, 46-2, 46-3, and 46-4. These electrically conducting connections 46-1 to 46-4 extend as horizontal strip lines beneath a corresponding one of the row of orifices 22. In this manner, each loudspeaker element 12 can be directly supplied with the electrical audio signals without the need for elaborate connections within the first substrate 10. Instead, the second substrate 20 is used to distribute the electrical audio signal across the array of loudspeaker elements. Due to the integration of the loudspeaker elements 12 within the substrate 10, the layered structure of the substrate 10 may be relatively complicated, already, so that arranging an audio signal distribution network within the first substrate 10, or at the first main surface 11 thereof, may be challenging and require striking one or more compromises. The second substrate 20 on the other hand, which is present anyway to act as a support and/or a part of the housing, typically has a relatively simple layer structure. Accordingly, the audio signal distribution network can be implemented at the first main surface 21 of the second substrate 20, or within an intermediate layer inside the second substrate 20, in connection with suitable connection pads to the first main surface 21 for ensuring an electrical connection to the loudspeaker elements.

Figure 5:
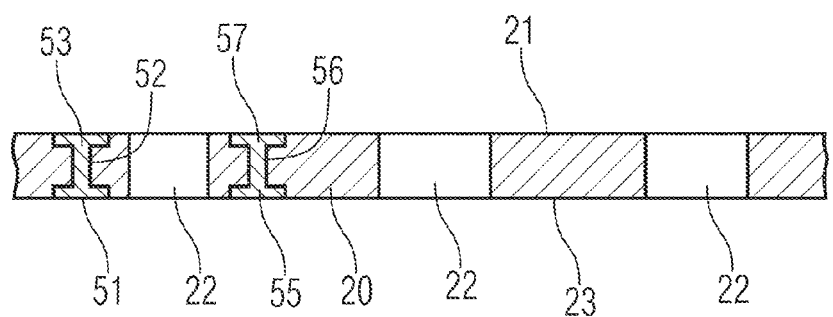
FIG. 5 shows a partial cross-section through a second substrate according to an embodiment of the teachings disclosed herein.

FIG. 5 shows a cross-section through the second substrate 20, according to another embodiment of the teachings disclosed herein. In this embodiment, the second substrate 20 comprises two loudspeaker input signal connectors 51, 52, which are arranged at the second main surface 23 of the second substrate 20. The loudspeaker input signal connector 51 is connected to an electrically conducting connection 52 which extends between the second main surface 23 and the first main surface 21 of the second substrate 20. At the first main surface 21, the electrically conducting connection 52 terminates in a connection pad 53 to which a loudspeaker element 12 may be connected during the flip-chip process according to the teachings disclosed herein. The loudspeaker input signal connector 55 is connected to an electrically conducting connection 56, extending vertically within the second substrate 20 to end in a connection pad 57. The connection pad 57 provides the second pole of an audio signal supply for the loudspeaker element 12. An audio signal distribution network for the remaining loudspeaker element 12 is not shown in FIG. 5 for the sake of clarity. It may be provided, either at the first main surface 21, or the second main surface 23 of the second substrate 20, in a manner similar to the audio signal distribution network shown in FIG. 4. In the alternative, the audio signal distribution network may be provided within the second substrate 20 by means of an intermediate layer.

The electrically conducting connections 52 and 56 may be obtained by means of e.g. lithography, etching, and/or metallization steps. With the arrangement shown in FIG. 5, the loudspeaker input signal(s) may be provided at the second main surface 23 of the second substrate opposite to the first main surface 21 of the second substrate 20 facing the first substrate 10. In this manner, the loudspeaker input signal connectors 51, 55, are provided at a sound propagating side of the housed loudspeaker array, which may be useful for connecting the housed loudspeaker array with a circuit providing the audio signals, depending on the configuration, the design, and/or the intended application in which the housed loudspeaker array is used.

There are at least two different ways to drive such an array of loudspeakers.

One method is an analog driving principle. All speakers in the array are driven in parallel with an audio signal. The maximum sound pressure level is given by the number of speakers in the array multiplied with the maximum stable amplitude of a single element. The limit of stability is given by the so called pull in voltage of the condenser configuration. Since the signal is highly distorted for such large actuation movements due to the nonlinear function of the condensor transducer, it is favorable to do a predistortion of the driving signal. Another characteristic of the sound transducer is the increasing response with increasing frequency of actuation. The driving ASIC can account for this effect by equalization.

An alternative driving mechanism is the so called digital sound reconstruction. Each single speaker is fully actuated into the mechanically limited positions (pull in to top stator or bottom stator for a differential system; pull in to stator or rest position for single stator transducer). The speaker elements produce sound pulses at a certain high carrier frequency above the audio band width e.g. at 80 kHz. By adding the number of pulses and modulation of the carrier frequency the audio signal can be reproduced. For this purpose the single elements can be binary grouped by wiring or be addressed individually e.g. by columns and rows. The dynamic range of such a digital array is given by the bit size e.g. 72 dB for a 12 bit array. The minimum/maximum sound pressure level is defined by the number of speakers in the smallest/largest bit.

Of course, in either case a larger number of speakers in an array can be driven as a phased array to produce directed sound.

There are numerous basic structures for speaker elements that may be used in conjunction with a housed loudspeaker array according to the teachings disclosed herein. For example, the speaker element may either comprise a membrane versus single stator system or a membrane with top and bottom stators.

Figure 6:
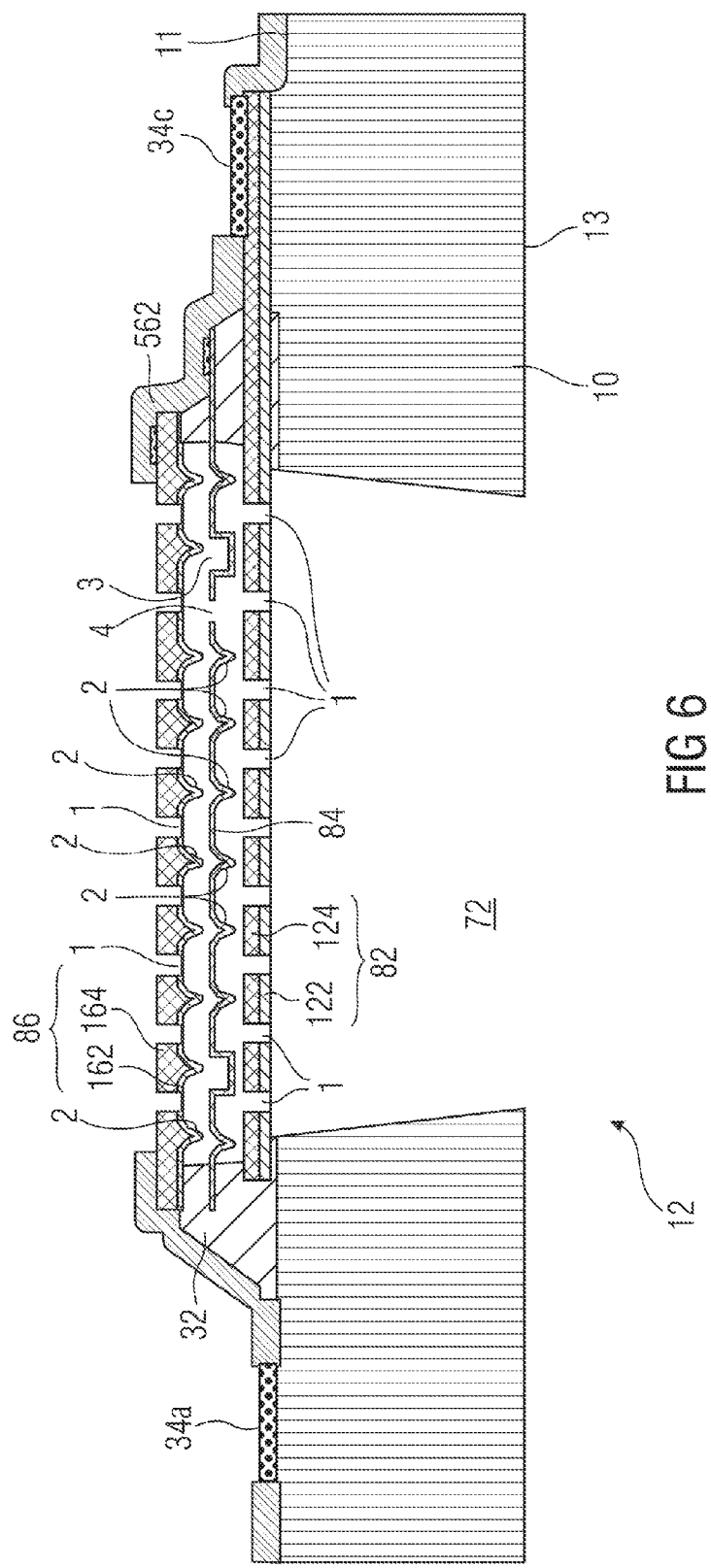
FIG. 6 shows a schematic cross-section through a loudspeaker element that may be used in a housed loudspeaker array according to the teachings disclosed herein.
Figure 7:
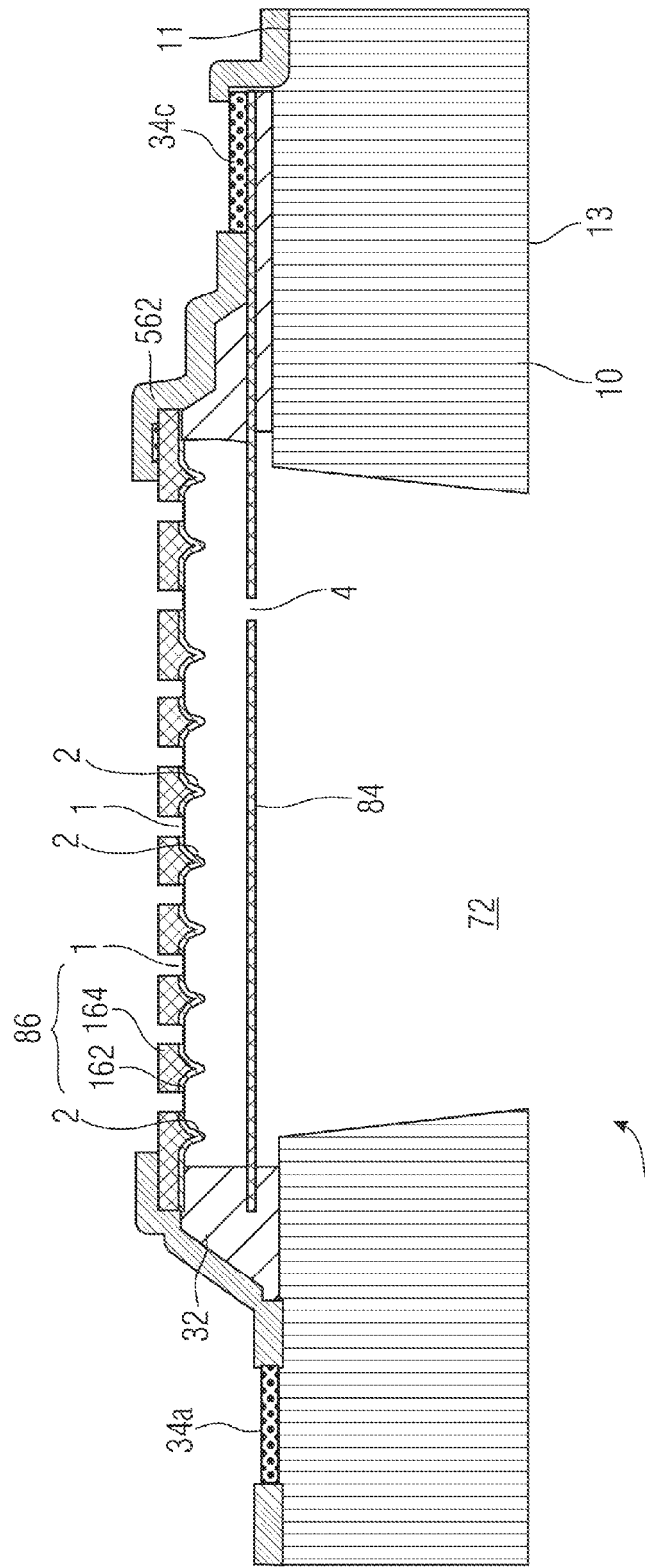
FIG. 7 shows a schematic cross-section through another loudspeaker element that may be used in a housed loudspeaker array according to the teachings disclosed herein.

FIGS. 6 and 7 show schematic cross-sections through silicon loudspeaker chips of the two mentioned different basic structures, respectively, that may be employed for the purposes of the teachings disclosed herein. Note that the dimensions are not to scale, and shadow lines are not (always) drawn. The loud-speaker chip of FIG. 6 comprises the substrate 10 as a base on which further layers of the loudspeaker are arranged. As used herein, the term substrate typically refers to the substrate per se and the further layers or structures that are arranged on the surface of the actual substrate. The substrate 10 comprises a cavity 72. The substrate 10 has a first main surface 11 and a second main surface 13. At the first main surface 11, several layers are arranged which form the actual loudspeaker. The loudspeaker comprises a first stator 82 which has two layers. The first layer is a stoichiometric silicon nitride (SiN) layer 122 with high tensile stress (for example, approximately one GPa). The second layer is a highly doped (or highly implanted) polysilicon layer 124. The polysilicon layer 124 is typically thicker than the stoichiometric SiN layer 122. The polysilicon layer 124 also serves as an electrode of a capacitor formed by the first stator 82 and a membrane 84. Both layers of a first stator 82 comprise a plurality of perforation holes of air holes, for allowing a relatively rapid exchange of air between a cavity 72 and the volume above the first stator 82. The first stator 82 is mainly provided in a sound transducing region of the loudspeaker and also in a region right of the cavity 72, which serves as an electrical connection of the first stator 82 to a connection pad 34c.

Adjacent to the left of the first stator 82 is a part of a support structure 32. The support structure 32 also extends upwards (away from the substrate 10). The support structure 32 is provided in a substantially annular region surrounding the sound transducing region of the loudspeaker. In the embodiment illustrated in FIG. 7, the radial outer surface of the support structure 32 has a frustoconical shape. This frustoconical shape is circumferentially interrupted in a region of the loudspeaker that is shown in the right part of FIG. 7, as the electrical connection at 34c is provided in this region and requires to be spread out to a certain degree. Accordingly, the support structure 32 has a stepped or stair-like shape in this region.

The membrane 84 is situated above the first stator 82. FIG. 7 shows the membrane 84 at a rest position in which the membrane 84 is at a distance from the first stator 82, and therefore does not mechanically contact the first stator 82. The membrane 84 is supported by, or suspended, or fixed, to the support structure 32 at a radially outer region of the membrane 84. The membrane 84 may comprise a crystallized silicon layer obtained by the positive amorphous silicon. The crystallization of the previously amorphous silicon occurs during a controlled oven process during the manufacture of the loudspeaker. A desired tensile stress of the membrane 84 may be controlled via the dopant and dopant concentration as well as by the temperature budget of the controlled oven process. A phosphor doping of the silicon layers serves to make the membrane 84 electrically conductive.

The membrane 14 comprises a number of structural features, such as anti-sticking bumps 2, a corrugation groove 3, and a pressurization hole 4. These structural features may be obtained during the formation of the membrane 84.

At a distance from the rest position of the membrane 84, a second stator 86 is supported by an upper edge of the support structure 32. This distance corresponds to a gap between the membrane 84 and the second stator 86. In the embodiment shown in FIG. 7, this gap width is substantially the same as the gap width between the first stator 82 and the membrane 84. The support structure 32 is typically deposited during one or more depositing steps. For example, a first depositing step may be performed after the first stator 82 has been formed, and a second depositing step may be performed after the membrane 84 has been formed. The thickness $t_1$, $t_2$ of each layer of the support structure 42 is typically between 1 and 3 µm. In order to have a symmetrical structure of the loudspeaker, the layer thicknesses of the two individually deposited layers of the support structure 32 in FIG. 7 are approximately equal. The support structure typically comprises materials selected from the following materials: oxide, TEOS (Tetraethyl Orthosilicate), BPSG (Borophosilicate Glass), or carbon.

The second stator 86 comprises two layers and thus has a structure similar to the structure of the first stator 82. The second stator 86 comprises a stoichiometric silicon nitrite layer 162 and a thicker, highly doped (or highly implanted) polysilicon layer 164. The polysilicon layer 164 serves as an electrode of a capacitor formed by the second stator 86, and the membrane 84. The second stator 86 comprises a plurality of air holes 1 and a plurality of anti-sticking bumps 2. Just as the first stator 82, the second stator 86 either has a high rigidity against deflection, or is subjected to a pronounced tensile stress, or both. The purpose of the high-rigidity and/or the tensile stress may be to confer stability to the first and second stators 82, 86. The high tensile stress, if present, is mainly provided by the stoichiometric silicon nitride layers 122, 162.

A passivation layer 562 covers parts of the substrate 10 that are still exposed after the formation of the second stator 86. The passivation layer 562 also covers the support structure 32, as well as selected parts of the first and second stators 82, 86. The passivation layer 562 may comprise a plasma nitride (OxiNitride). As an alternative, the passivation layer 562 may also be obtained from, or on the basis of, polyimide. Some regions of the loudspeaker are exempt from the passivation layer 562, such as the connection pads 34a, 34c and the upper surface of the second stator 86 in the sound transducing region.

The structure shown in FIG. 7 is similar to the structure shown in FIG. 6. The difference is that FIG. 6 shows a membrane versus single stator system. The membrane 84 is substantially flat, that is, the membrane 84 does not comprise the anti-sticking bumps 2 or the corrugation grove 3. The anti-sticking bumps 2 are not absolutely necessary in this configuration because the stator 86 comprises anti-sticking bumps 2 so that a sticking of the membrane 84 at the stator 86 can normally be prevented. As an alternative the membrane 84 may comprise the anti-sticking bumps 2 instead of the stator 86. Notwithstanding the configuration shown in FIG. 7, the corrugation grove 3 could be present for the reasons stated above.

In the exemplary configuration of FIGS. 6 and 7, the extension of the membrane region, or sound transducing region, is circular with a diameter of 0.4 mm to 3 mm. Other forms such as square, rectangular, hexagonal, or oval membranes are equally conceivable.

The structures shown in FIGS. 6 and 7 may be used as an analog loudspeaker or a digital loudspeaker. The exemplary loudspeaker shown in FIGS. 6 and 7 are configured as an electrostatic loudspeaker.

FIGS. 8 to 16 illustrate a method for manufacturing a housed loudspeaker array according to the teachings disclosed herein.

Figure 8:
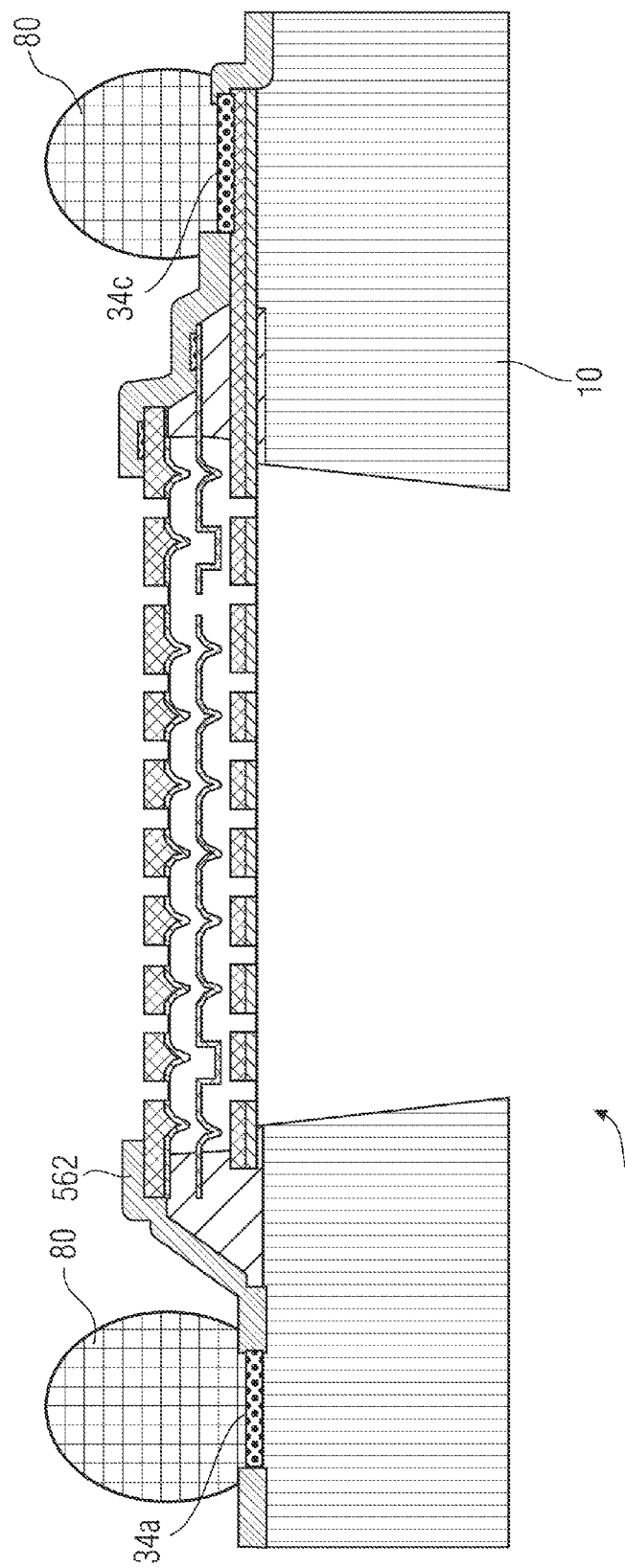
FIG. 8 shows a schematic cross-section through a loudspeaker element during an early stage of the manufacturing process.

FIG. 8 shows a schematic cross-section through a loudspeaker element 12 that is a part of an array of loudspeaker elements after solder balls 80 have been deposited on the connection pads 34a and 34c. Before the solder balls 80 are applied to the connection pads 34a and 34c, the semiconductor wafer bumping sites are typically prepared. This preparation may include cleaning, removing insulating oxides and providing a pad metallurgy that protects the integrated circuit, while making a good mechanical and electrical connection to the solder balls 80 and the other chip that is involved in the flip-chip process.

This preparation is also called under-bump metallization and generally consists of successive layers of metal with functions described by their names. The "adhesion layer" must adhere well to both, the bond pad metal 34a, 34c, and the surrounding passivation 562, providing a strong, low-stress mechanical and electrical connection. The "diffusion barrier" layer limits the diffusion of solder into the underlying materials. The "solder wetable" layer offers an easily wetable surface to the molten solder during assembly, for a good bonding of the solder to the underlying metal. A "protective layer" may be required to prevent oxidation of the underlying layer.

The solder ball 80 may be formed or placed on the under-bump metallization in many ways, including evaporation, electroplating, printing, jetting, stud bumping, and direct placement. The results of these methods may differ in size and spacing ("pitch"), solder components and composition, cost, manufacturing time, equipment required, assembly temperature, and under-bump metallization.

Figure 9:
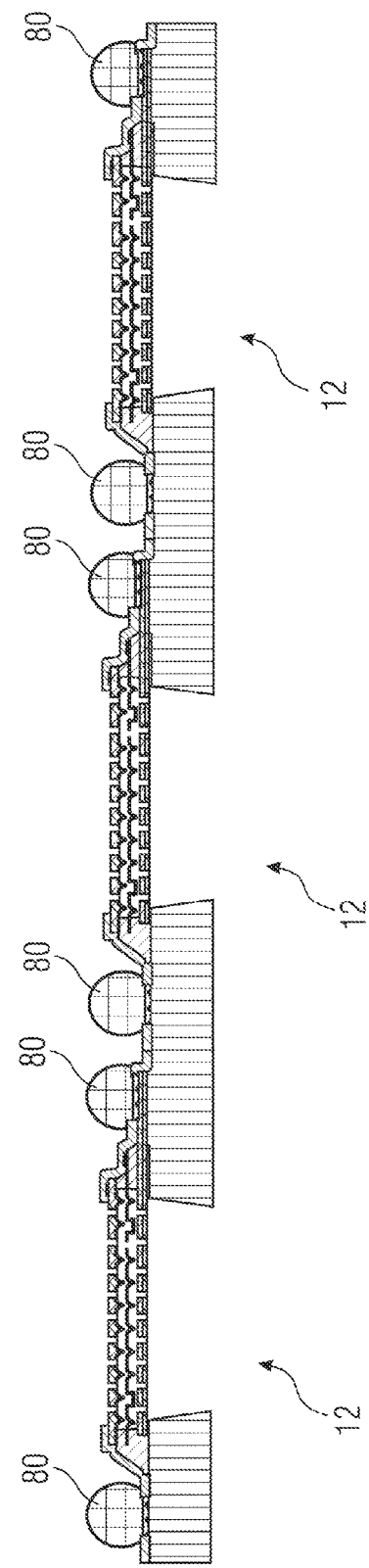
FIG. 9 shows a schematic cross-section through an array of loudspeaker elements during the early stage of the manufacturing process mentioned in FIG. 8.

FIG. 9 shows a cross-section through an array of loudspeaker elements 12. For the reasons stated above, a plurality of loudspeaker elements 12 is typically employed.

Figure 10:
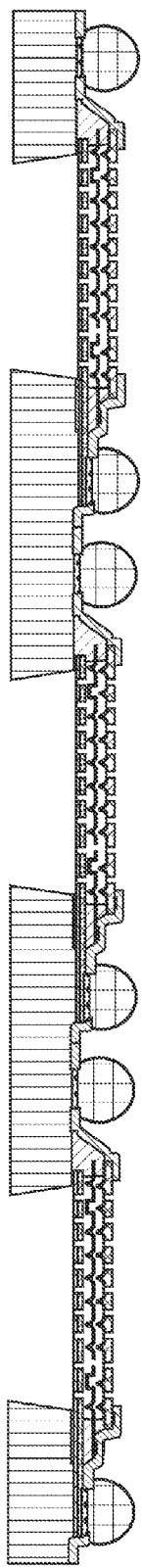
FIG. 10 shows a schematic cross-section of an array of loudspeaker elements during a flip-chip step of the manufacturing process.

FIG. 10 shows a cross-section of the loudspeaker element array from FIG. 9 after it has been flipped up-side-down according to a flip-step of the flip-chip process.

Figure 11:
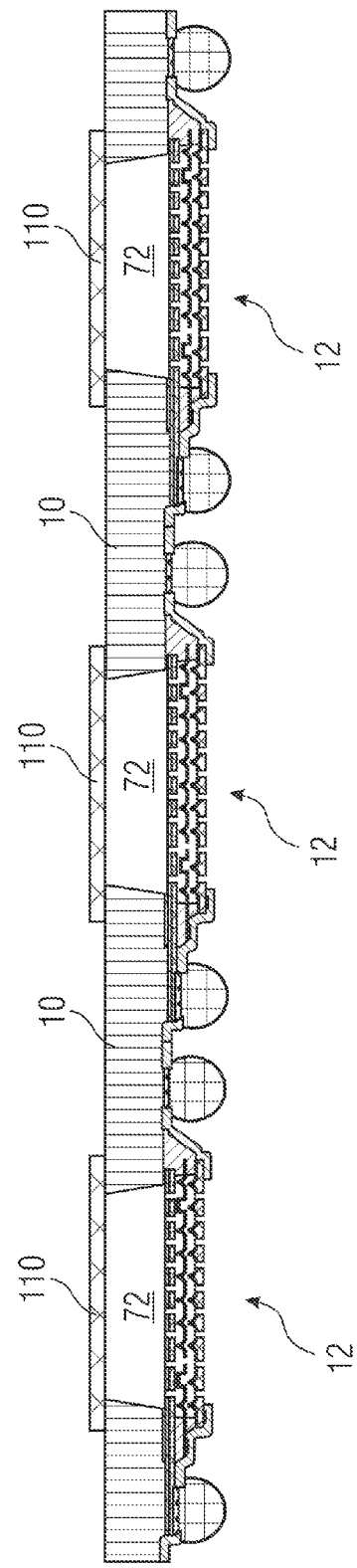
FIG. 11 shows a schematic cross-section of an array of loudspeaker elements at a step of the manufacturing process subsequent to the step shown in FIG. 10.

In FIG. 11, the cavities 72 of the plurality of loudspeaker elements have been closed by means of a robust, structured film 110. The robust, structured film 110 may be a contiguous film, or each cavity 72 may be closed by an individual robust, structured film 110. It would also be possible to provide a net-like film which provides a film material at the locations of the cavities 72 and relatively narrow connections between these areas in order to maintain a spacing of the cavity-covering portions of a net-like film 110. As an alternative to the robust, structured film 110, caps could be used in order to obtain larger cavities 72. The caps may be differently sized in order to obtain differently sized cavities 72, so that the loudspeaker element 12 may have different resonance frequencies, if this is desired. The robust, structured film 110 may be made from a polymer such as a thermal plastic material, or a thermal setting material. Other materials may also be used. Closing can also be done by a rigid plate e.g. a piece of silicon or even a cavity structured silicon or glass wafer. The role of the robust, structured film or the caps is to close the cavity 72 of each loudspeaker element 12 in a substantially rigid manner, so that the volume of the cavity 72 remains substantially constant during a sound transducing process in the course of which the membrane 84 moves back and forth. A less robust film could at least partially follow the movement of the membrane 84, possibly with a phase lag, which could result in a reduced sound pressure level and/or distortions. As an alternative to using a film, the cavities 72 may be closed by a bottom provided by the substrate 10, i.e. the cavity 72 would actually be a blind hole in this latter case.

Figure 12:
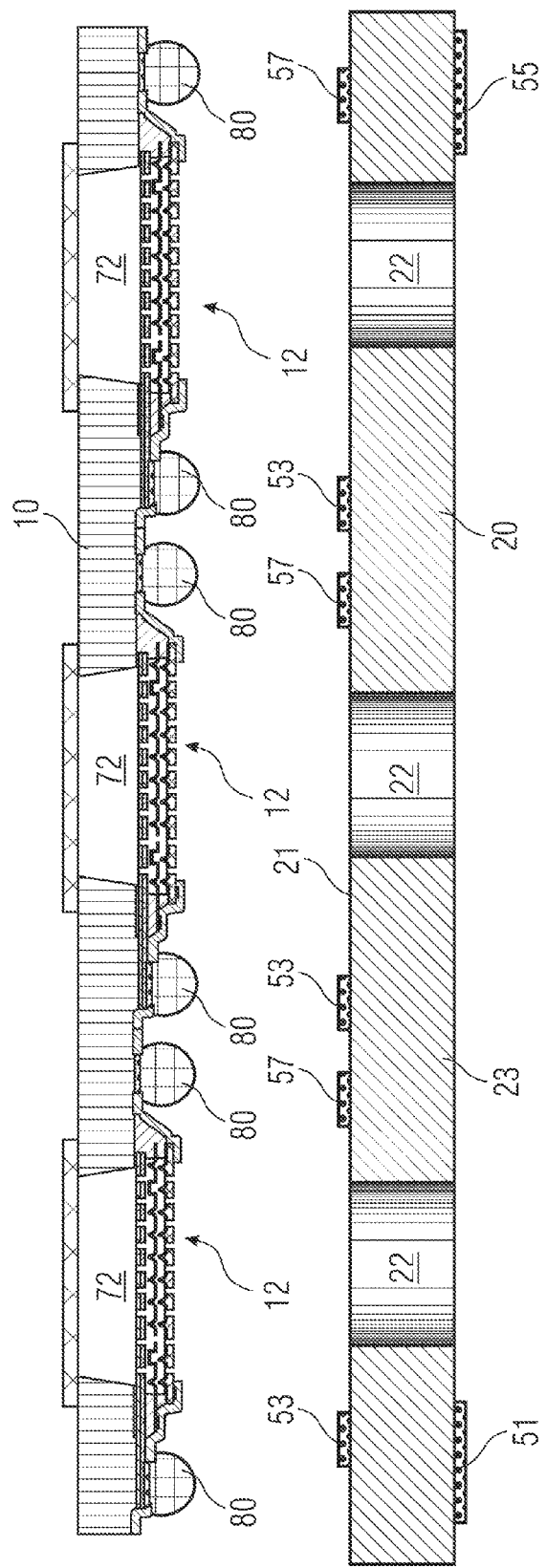
FIG. 12 shows a schematic cross-section through an array of loudspeaker elements and a second substrate prior to fixing the second substrate to the array.

FIG. 12 shows the first substrate 10 with the plurality of loudspeaker elements 12 and the solder balls 80 applied to the connection pads 34a, 34c aligned with the second substrate 20, but not yet attached to the second substrate 20. In particular, the loudspeaker elements 12 are aligned with the orifices 22 of the second substrate 20. FIG. 12 shows the housed loudspeaker array prior to fixing the second substrate 20 to the first substrate 10. In a manner similar to the embodiment shown in FIG. 5, the second substrate 20 comprises a first loudspeaker input signal connector 51 and a second input signal connector 55 at the second main surface 23 of the second substrate 20. Connection pads 53 provided at the first main surface 21 of the second substrate 20 are electrically connected to the first loudspeaker input signal connector 51. Likewise, connection pads 57 that are also provided at the first main surface 21 of the second substrate 20 are electrically connected to the second loudspeaker input signal connector 55. The solder balls 80 are aligned to the connection pads 53 and 57 so that each solder ball 80 is in mechanical and electrical contact with one of the connections pads 53 or 57. The substrate 20, i.e. the support, may comprise one or several layers of conducting tracks which may be used, for example, to combine or group signal paths. For each array element, the support or second substrate 20 comprises a sound orifice 22 through which the elements emit the sound that they produce.

Figure 13:
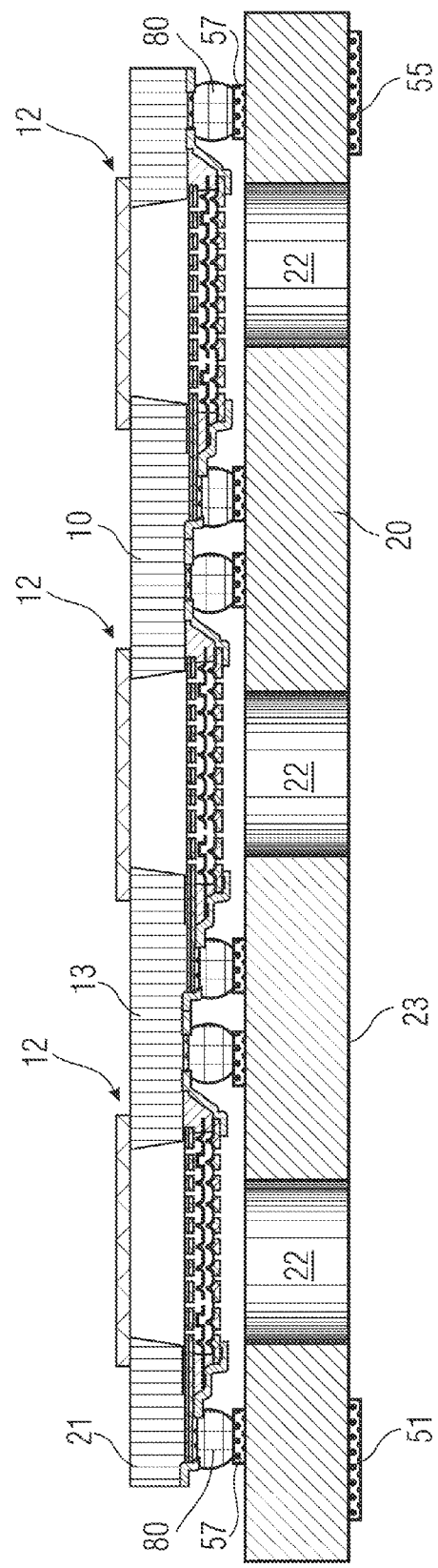
FIG. 13 shows the loudspeaker array subsequent to a soldering step of the manufacturing process.

In FIG. 13 the first substrate 10 is soldered to the second substrate 20, i.e. the support plate. In particular, the solder balls 80 are now electrically and mechanically connected to the connection pads 53, 57.

Figure 14:
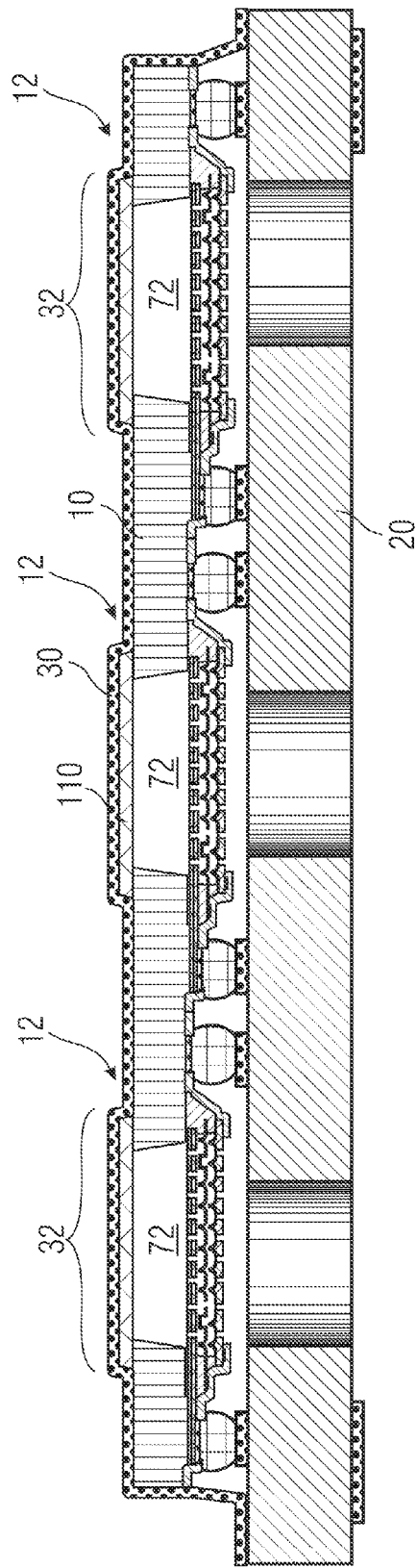
FIG. 14 shows a closing of the loudspeaker array by means of a deep-drawn film.
Figure 15:
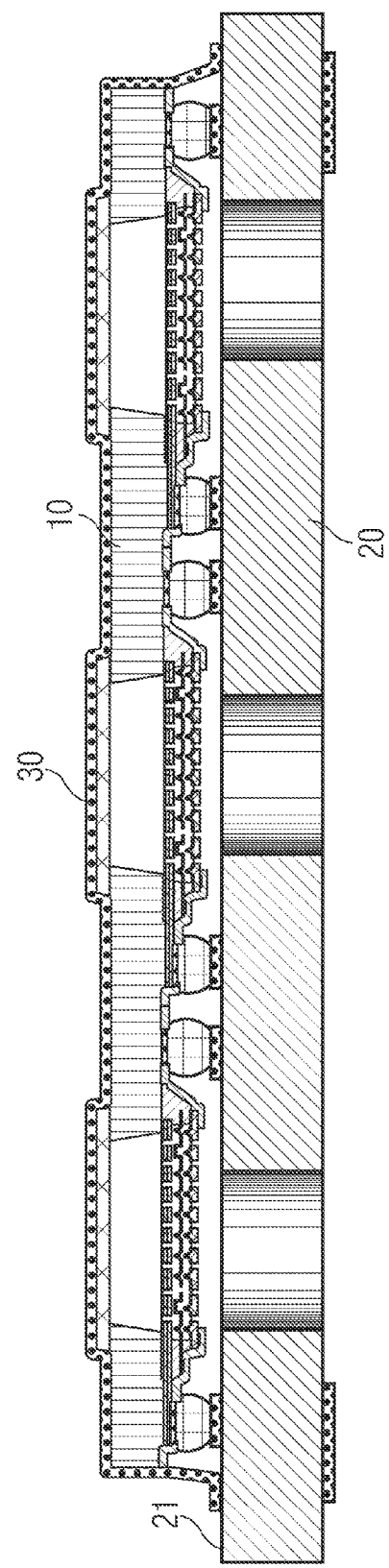
FIG. 15 shows a structuring of the deep-drawn film at the edges.
Figure 16:
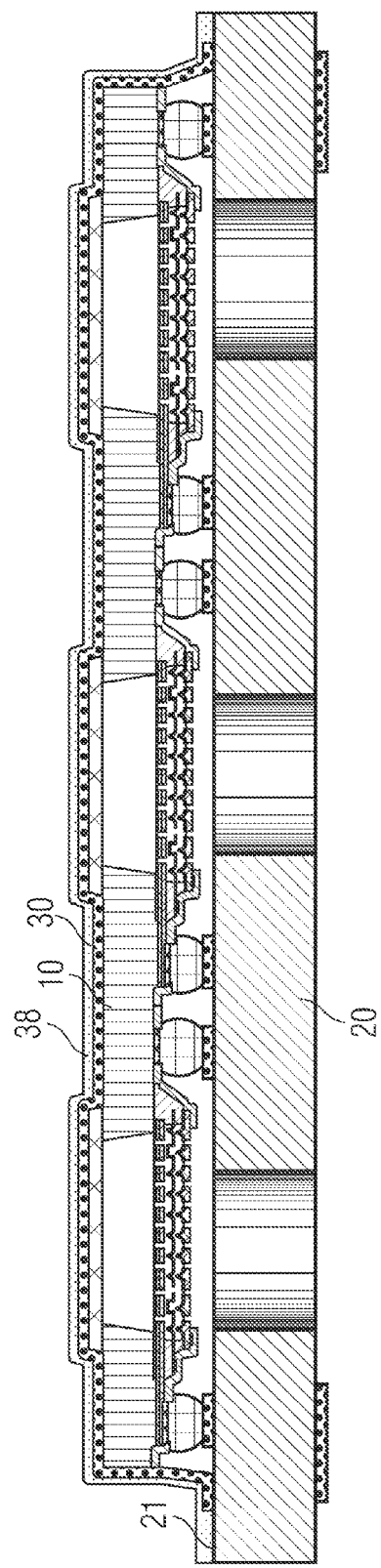
FIG. 16 shows the housed loudspeaker array resulting from the manufacturing process according to the teachings disclosed herein.

After this step different alternative packaging variants can be realized: A first variant is based on a deep drawn film as illustrated in FIGS. 14 to 16. A second variant is an overmolded flat plastic package (FIGS. 17 and 18) and a third variant is a naked but sealed silicon substrate (FIG. 19).

FIG. 14 shows how the compound formed by the first substrate 10 and the second substrate 20 is closed by means of a deep-drawn film 30. Due to the robust, structured film 110 used to close the cavities 72 in the depicted embodiment, the cover 30 forms a plurality of little bumps 32 in the embodiment shown in FIG. 14.

FIG. 15 shows a state of the housed loudspeaker array during a manufacturing process in which the deep-drawn film 30 has been structured at the edge of the module. Thus, portions of the first main surface 21 of the second substrate 20 that have been covered by the deep-drawn film 30 in the configuration shown in FIG. 14, are now again exposed.

FIG. 16 shows a substantially completed housed loudspeaker array. The module has been protected against electromagnetic irradiation by means of a metallization 38 of the deep-drawn film 30 and the exposed areas of the first main surface 21 of the second substrate 20. The metallization 38 may be connected to the second substrate 20 at an opening (edge) and possibly to an electrical ground connection.

In case several modules are manufactured as a compound, the compound can now be singulated to obtain the individual modules.

Figure 17:
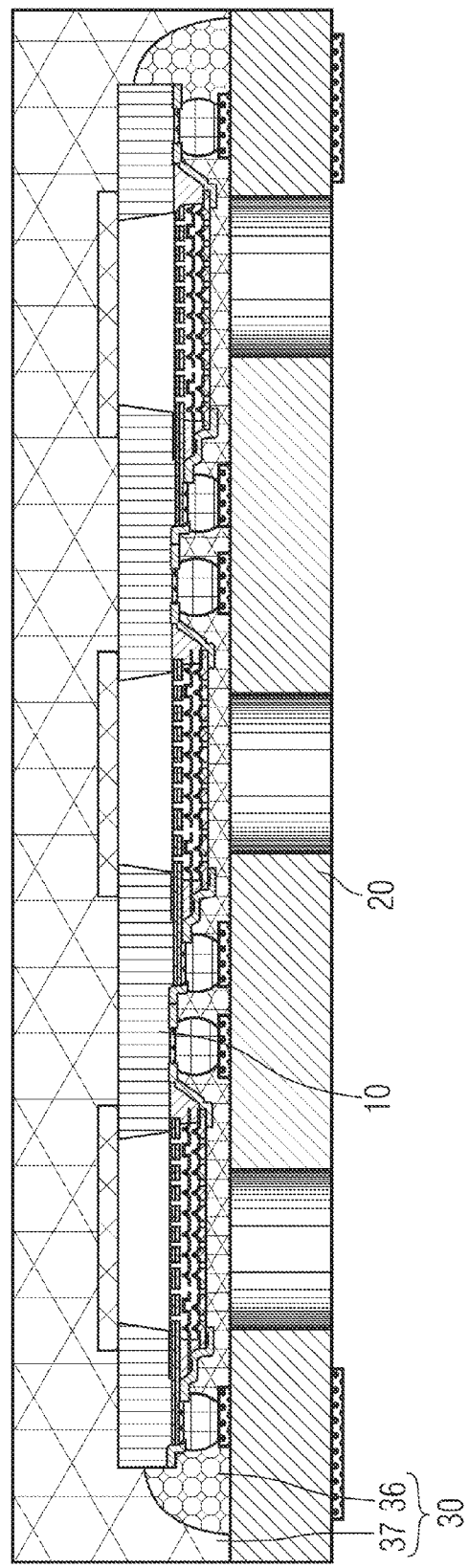
FIG. 17 shows a housed loudspeaker array according to another aspect of the teachings disclosed herein in which the cover comprises an encapsulant.

FIG. 17 shows a housed loudspeaker array according to another aspect of the teachings disclosed herein. The cover 30 comprises an encapsulant 37. The encapsulant 37 can be made from plastic, a mold material, or a globe top material. A flat surface finish may be provided. Furthermore, the housed loudspeaker array may comprise a seal ring 36 which may be made of glue or silicone. The seal ring 36 may be configured to prevent the acoustical signal to escape to the side instead of the sound port.

Figure 18:
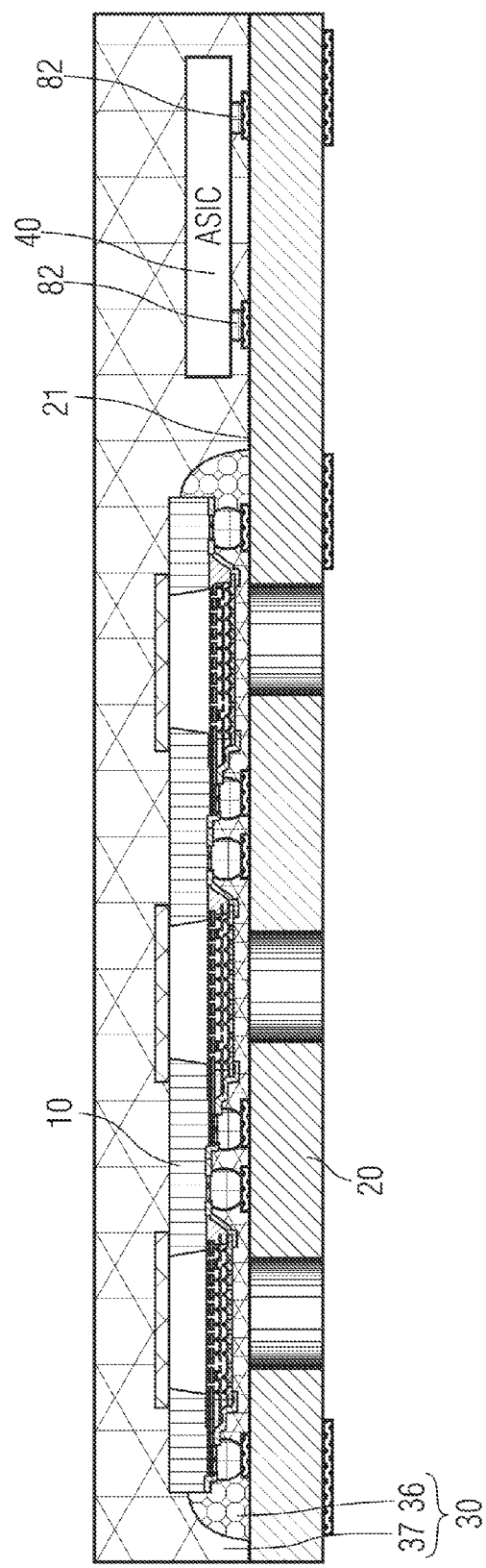
FIG. 18 shows a housed loudspeaker array comprising an application specific integrated circuit fixed to the second substrate in a flip-chip manner, in accordance with the disclosed teachings.
Figure 19:
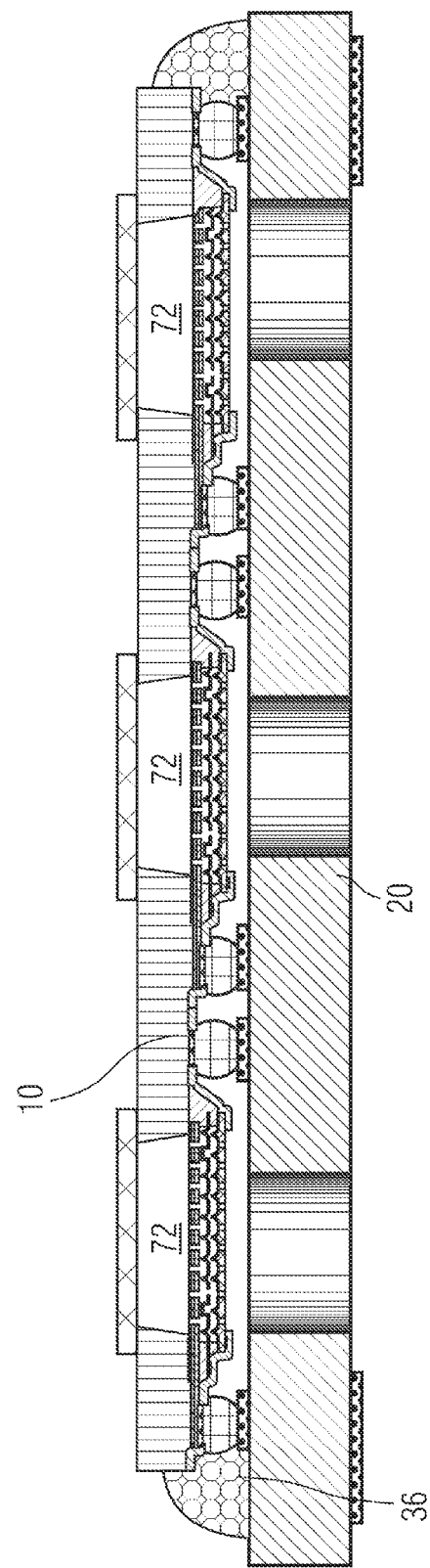
FIG. 19 shows a naked but sealed variant of the loudspeaker array comprising a seal ring.

FIG. 18 shows a housed loudspeaker array according to a further aspect of the teachings disclosed herein. The structure shown in FIG. 18 is based on the one shown in FIG. 17. In addition, an electronic device such as an application specific integrated circuit (ASIC) 40 is placed at the first main surface 21 of the second substrate 20 laterally to the first substrate 10 and the loudspeaker elements formed therein. The ASIC 40 may be fixed to the second substrate in substantially the same manner as the first substrate 10, i.e., by means of a flip-chip process. In fact, it may be possible to fix the ASIC 40 to the second substrate 20 during the same flip-chip process that is used for the fixing the first substrate 10 to the second substrate 20. In case a flip-chip process is used, solder balls 82 are provided to electrically and mechanically connect the ASIC 40 with the second substrate 20. The ASIC 40 may comprise driving circuitry for the loudspeaker array, such as a predistortion circuit or an equalizer. The encapsulant 37 also covers the ASIC 40. The second substrate 20 may comprise electrical connections between a location of the ASIC 40 and a location of the first substrate.

FIG. 19 shows a naked but sealed variant of the loudspeaker array. A seal ring 36 similar to the one shown in FIGS. 17 and 18 is used to prevent the acoustical signal to escape to the side instead of the sound port. The seal ring 36 may be made from glue or silicone. The seal ring may be prefabricated or applied as a liquid or a gel to the assembled loudspeaker array and then cured. The cavities 72 of the plurality of loudspeaker elements have been closed by means of a robust, structured film 110.

The teachings disclosed herein show how a provisioning of electrical connections for a micro-electromechanical loudspeaker array and a closing of the micro-electromechanical loudspeaker array may be achieved using substantially the same elements for both, electrical connections and closing. Furthermore, both aims are attained substantially during the same process and/or process steps. By using the proposed flip-chip technique for a loudspeaker array, the large number of electrical connections required to supply an electrical audio signal to each one of the loudspeaker elements are established during the flip-chip step. At the same time, the entire array is closed in a global manner by means of the second substrate 20 and the cover 30. It is optionally possible to locate a part of a driving circuitry for the plurality of loudspeaker elements 12 in the second substrate 20, which is provided anyway as a part of the housing. Thus, the teachings disclosed herein provide a simpler and/or cheaper manufacturing process by combining the provisioning of electrical connections between the first substrate 10 and the second substrate 20 with the provisioning of a housing for the loudspeaker array.

Although some aspects have been described in the context of an apparatus, it is clear that these aspects also represent a description of the corresponding method, where a block or device corresponds to a method step of a feature of a method step. Analogously, aspects described in the context of a method step also represent a description of a corresponding block or item or feature of a corresponding apparatus.

Furthermore, although the dependent claims are typically dependent on only one other claim, their technical features may be combined with each other to provide further embodiments of the teachings disclosed herein. Technical features described in the description or shown in the drawings may also be combined with technical features recited in an independent claim or a combination of an independent claim and a dependent claim. A person skilled in the art may therefore select specific technical features from this disclosure to form embodiments falling under the teachings disclosed herein.

The above-described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details represented by way of description and explanation of the embodiments herein.

What is claimed is:

1. A housed loudspeaker array comprising:
   a first substrate having a plurality of loudspeaker elements formed therein;
   a second substrate fixed at a first surface of the first substrate in a flip-chip manner and comprising a plurality of orifices that are aligned with loudspeaker elements of the plurality of loudspeaker elements of the first substrate; and
   a cover applied to a second surface of the first substrate, the second surface opposite the first surface.

2. The housed loudspeaker array of claim 1, wherein the cover comprises a film that is applied to the second surface of the first substrate.

3. The housed loudspeaker array of claim 2, wherein the cover further comprises a further film arranged facewise adjacent to the film, wherein one of the film and the further film is a plastic film and the other film is a metallic film.

4. The housed loudspeaker array of claim 1, wherein the cover comprises at least one of an encapsulant and/or a globe top material.

5. The housed loudspeaker array of claim 1, wherein the second substrate comprises a loudspeaker input signal connector and an electrically conducting connection between the loudspeaker input signal connector and at least one of the plurality of loudspeakers.

6. The housed loudspeaker array of claim 5, wherein the loudspeaker input signal connector is arranged at a second main surface of the second substrate opposite to a first main surface of the second substrate facing the first substrate.

7. The housed loudspeaker array according to claim 1, further comprising an electrical connection between the first substrate and the second substrate.

8. The housed loudspeaker array according to claim 1, further comprising an electronic device fixed to the first surface of the second substrate laterally to the first substrate.

9. A housed loudspeaker array comprising:
   a first substrate having a plurality of loudspeaker elements formed therein;
   a second substrate fixed at a first surface of the first substrate in a flip-chip manner and comprising a plurality of apertures that are aligned with loudspeaker elements of the plurality of loudspeaker elements of the first substrate; and
   a cover comprising a deep-drawn film applied to a second surface of the first substrate, the second surface opposite the first surface.

10. A method for manufacturing a housed loudspeaker array, the method comprising:
    providing a first substrate having a plurality of loudspeaker elements;
    providing a second substrate comprising a plurality of orifices arranged in a manner corresponding to the plurality of loudspeaker elements;
    fixing the second substrate to a first surface of the first substrate in a flip-chip manner so that the plurality of orifices are aligned with the loudspeaker elements of the plurality of loudspeakers of the first substrate; and
    applying a cover to a second surface of the first substrate opposite to the first surface.

11. The method according to claim 10, wherein the cover comprises a film.

12. The method according to claim 10, wherein applying the cover comprises applying at least one of an encapsulant and/or a globe top material to the second surface of the first substrate.

13. The method according to claim 10, further comprising:
    applying solder balls to at least one of the first substrate and/or the second substrate prior to fixing the second substrate to the first surface of the first substrate.

14. The method according to claim 10, wherein the first substrate comprises a plurality of cavities corresponding to the plurality of loudspeaker elements and wherein the method further comprises:
    closing the plurality of cavities at the second surface prior to applying the cover to the second surface using a robust structured film or a plurality of caps.

15. The method according to claim 10, wherein the second substrate comprises at least one layer of conducting paths and wherein fixing the second substrate to the first substrate comprises providing electrical connections between a plurality of first connectors arranged on the first surface of the first substrate and a plurality of second connectors arranged on the second substrate.

16. The method according to claim 10, wherein applying the cover comprises fixing the cover to the second substrate in a region surrounding the first substrate, the method further comprising:
    structuring the cover in the region surrounding the first substrate.

17. The method according to claim 16, further comprising:
    applying a metallization to the cover and the region surrounding the first substrate so that the metallization is in contact with the second substrate.

18. The method according to claim 16, further comprising:
    singulating the second substrate in the region surrounding the first substrate to obtain a singulated housed loudspeaker array.

19. The method according to claim 10, wherein the cover comprises a film and the method further comprises:

deep-drawing the film around the first substrate and fixing a portion of the deep-drawn film to the second substrate.

20. The method according to claim 10, wherein providing the second substrate comprises forming at least one subarray enable element within or at the second substrate configured to enable at least one subarray of the array of loudspeakers based on an audio signal.

21. The method according to claim 10, wherein providing the second substrate comprises forming at least one layer of conducting paths within the second substrate and connecting the conducting paths with connectors at a surface of the second substrate.

\* \* \* \* \*